United States Patent [19]

Doran

[11] Patent Number: 5,684,811
[45] Date of Patent: Nov. 4, 1997

[54] METHOD AND APPARATUS FOR DECODING CONVOLUTIONALLY ENCODED INFORMATION

[75] Inventor: Patrick Joseph Doran, Plantation, Fla.

[73] Assignee: Motorola, Inc., Schaumburg, Ill.

[21] Appl. No.: 523,103

[22] Filed: Sep. 1, 1995

[51] Int. Cl.$^6$ ............................................. H03M 13/12
[52] U.S. Cl. ................................................. 371/43
[58] Field of Search ................................................. 371/43

[56] References Cited

U.S. PATENT DOCUMENTS

| | | | |
|---|---|---|---|
| 5,208,816 | 5/1993 | Seshardi et al. | 371/43 |
| 5,229,767 | 7/1993 | Winter et al. | 341/50 |
| 5,406,570 | 4/1995 | Berrou et al. | 371/43 |
| 5,537,444 | 7/1996 | Nill et al. | 375/341 |
| 5,537,445 | 7/1996 | Blaker et al. | 375/341 |
| 5,586,128 | 12/1996 | Chen | 371/43 |
| 5,588,028 | 12/1996 | Parizhsky | 375/341 |

*Primary Examiner*—Stephen M. Baker
*Attorney, Agent, or Firm*—Andrew S. Fuller

[57] ABSTRACT

An apparatus (800) processes a data stream of convolutionally encoded information and generates decoded information using a series of symbol selections that potentially correspond to at least a portion of the data stream (610, 620). A first reliability indication is obtained for a particular decision made for a symbol selection (630). When the reliability indicator does not satisfy a particular criteria, a traceback is performed along the series of symbol selections to develop a second reliability indication based on whether, after adjusting for allowable error patterns, an alternative set of symbol selections yields the decoded information within a predetermined number of symbol selections (635, 640, 645, 650, 655, 660, 665). An action is taken based on the second reliability indication (670).

15 Claims, 5 Drawing Sheets

METHOD AND APPARATUS FOR DECODING CONVOLUTIONALLY ENCODED INFORMATION

TECHNICAL FIELD

This invention relates in general to decoders, including but not limited to, decoders for convolutionally encoded information.

BACKGROUND

Digital information transferred over noisy transmission channels are subjected to the introduction of errors. In prior art applications, such digital information is frequently encoded to support a variety of purposes, including error correction. A particularly successful encoding technique includes the use of convolutional encoding. While suitable for error correction or avoidance, such convolutional codes typically have no inherent error detection capabilities. Accordingly, convolutional encoding is often supplemented by the inclusion of error control symbols for error detection, which reduces the number of symbols available for data transfer or error correction.

The Viterbi algorithm, or a derivation thereof, is a popular way of decoding convolutionally encoded information. The Viterbi algorithm is an efficient way of determining the likelihood that a particular received symbol $X_j$ represents a transmitted symbol $Y_j$ that may have been influenced by noise in the transmission channel. The Viterbi algorithm uses the fact that a convolutional encoder is a state machine in which each input symbol causes a state transition and an associated output symbol. For example, FIG. 1 represents a convolutional encoder as is common in the prior art. Input symbols 11 are combined with previous input symbols 12 using combinational logic 15 to present output symbols 17 which are then available for transmission, storage, or otherwise. FIG. 2 represents a trellis diagram which is a popular graphical way of viewing convolutional coding. In this example, a column of rows represents all of the possible states in the convolutional encoder at some point in time. The possible state transmissions from a time j to a time j+1 are represented by a single stage of the trellis.

For decoding purposes, a trellis diagram may be constructed representing the received symbols which a decoder may use to determine the most likely series of state transitions at the encoder. FIG. 3 shows a four stage, eight state trellis diagram for a typical decoder. For each received symbol, a metric is computed which represents a distance between the received symbol and each of the possible transmitted symbols. The Viterbi algorithm uses a traceback process to determine an ideal path through the trellis. Starting at the last trellis stage and working back to the first stage, it calculates the shortest path to each state at each stage by accumulating branch metrics along each path, such as on paths 401 and 402 in FIG. 4. During the traceback, only the best path into each state is stored, and other potential paths discarded. Eventually, only the shortest path remains, and the likely received transmitted symbol sequence is determined from this path.

The prior art describes a method to provide error detection capability when using convolutional codes without using explicit error detection codes in U.S. Pat. No. 5,229,767, issued to Winter et al., on Jul. 20, 1993, for A Decoder For Convolutionally Encoded Information, which is hereby incorporated by reference. In a particular application of this method, path information from the Viterbi algorithm is used to find a minimum delta value at those stages in the trellis which correspond to a particular category of input symbols. This particular category preferably has more robust coding for error correction purposes. A delta value $D_{f,g}$ is the difference between winning and losing paths into a state "f" at stage "g" while tracing though the trellis. A small minimum delta value implies that the winning path and the losing path into a particular state have nearly identical path metrics, and therefore, the choice of path is uncertain, i.e., potentially unreliable. Conversely, a large minimum delta value implies high integrity in the decoded path decision. This relationship between minimum delta value and the integrity of the Viterbi decoder's path decision is used as a basis for error detection.

Error detection based on the uncertainty of path discard decisions may be susceptible to a significant number of instances where an error is indicated, when in fact the symbols were properly decoded. Such occurrences may have an averse impact when this error detection technique is used in voice communications. While particularly useful in many instances, this error detection technique, as presently implemented in the prior art, may not be suitable for some applications. Therefor, an improved method and apparatus that can provide error detection capability when using convolutional codes, without using an explicit error detection code, is needed.

DETAILED DESCRIPTION OF THE PREFERRED EMBODIMENT

Figure 1:
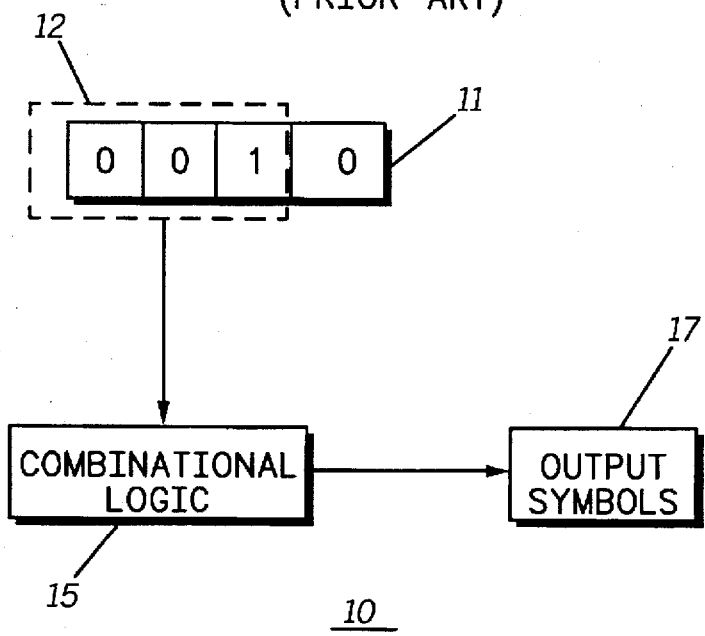
FIG. 1 is a block representation of a prior art encoder.
Figure 2:
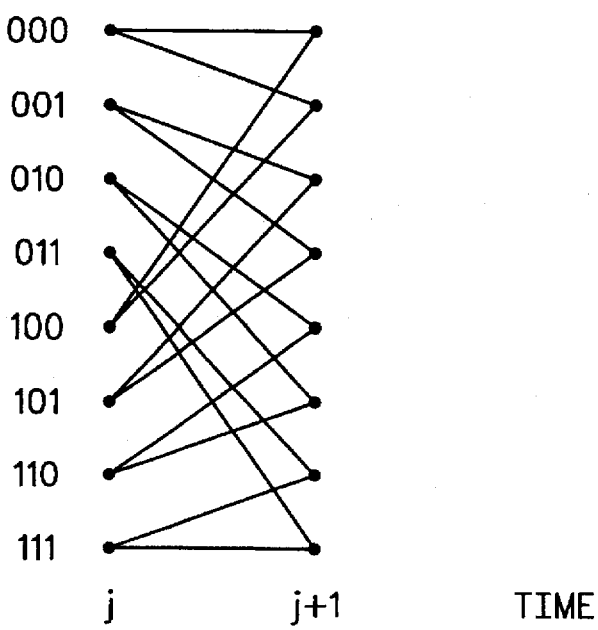
FIG. 2 is a partial trellis diagram of a state machine representing the convolutional encoder of FIG. 1, as is common in the prior art.
Figure 3:
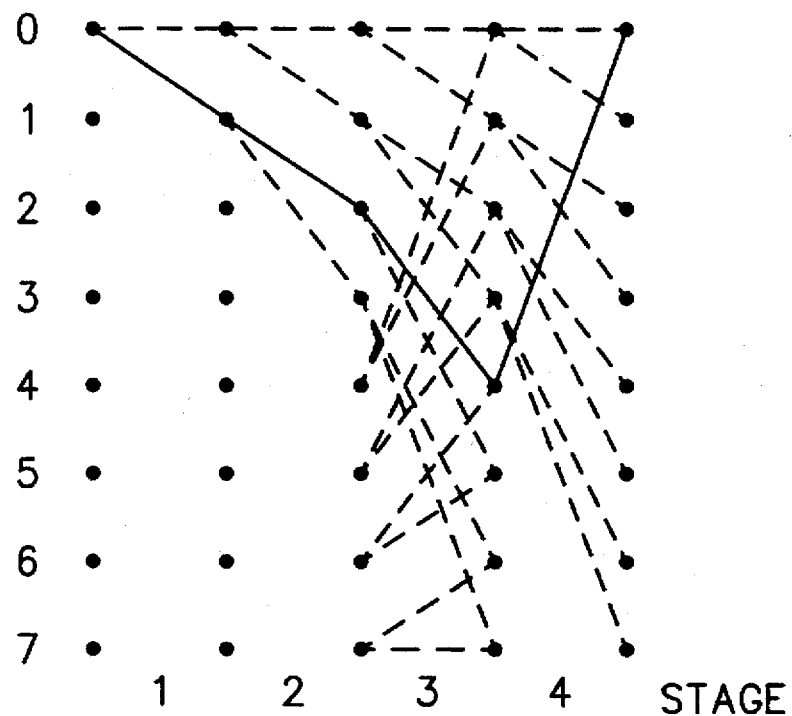
FIG. 3 is a trellis diagram such as used with a Viterbi Algorithm decoder of the prior art.
Figure 4:
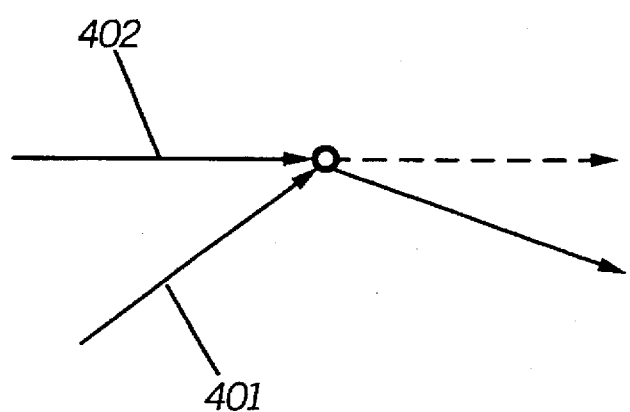
FIG. 4 is a representation of a path discard decision based on branch metrics for tracing through the trellis diagram of FIG. 3.

While the specification concludes with claims defining the features of the invention that are regarded as novel, it is believed that the invention will be better understood from a consideration of the following description in conjunction with the drawing figures, in which like reference numerals are carried forward.

Generally, the present invention provides a method and apparatus for processing convolutionally encoded information, and for determining when decoded information is not particularly reliable. A data stream representing convolutionally encoded information is decoded using a series of symbol selections, such as can be obtained from a Viterbi Algorithm decoder. At symbol selection decision points, such as choosing between competing information paths, a reliability or integrity factor is obtained for a particular decision. When the reliability factor does not satisfy a particular threshold, a traceback is performed along the series of symbol selection decisions to determine whether an alternative set of symbol selections, or information path, would yield the decoded information within a predetermined number of symbol selections if adjustments are made for allowable error patterns. For a Viterbi Algorithm decoder, a path traceback along a selected information path and a discarded information path must yield convergence within a predetermined number of trellis stages at a state which would be consistent with a known error pattern. If such convergence does not occur, then a marginal path discard decision, by itself, is not determined to produce unreliable decoded information.

Figure 5:
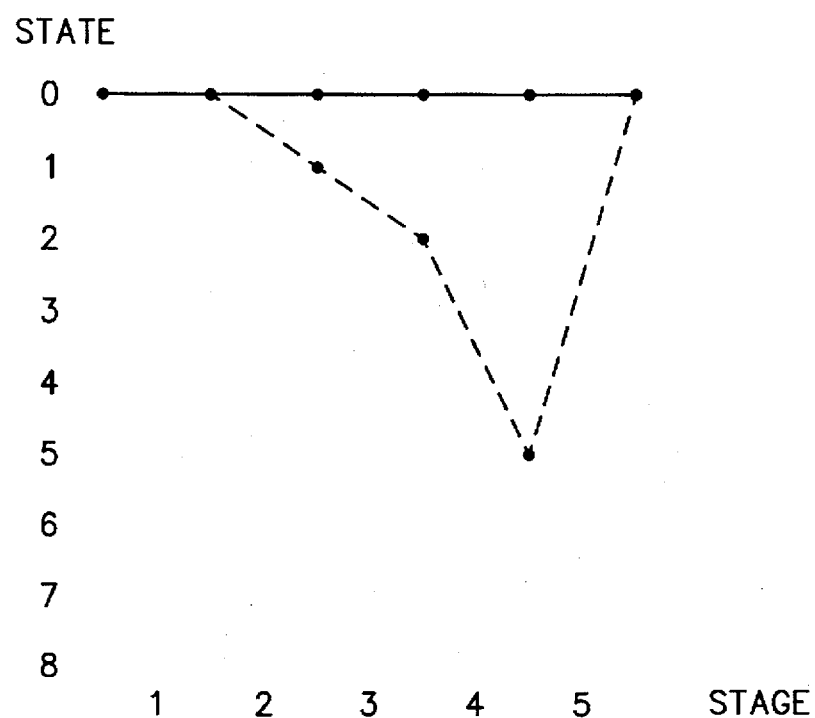
FIG. 5 is a trellis diagram in which the ideally decoded symbols should be all zeros.

The present invention takes advantage of knowledge of probable error events when decoding convolutionally encoded information. An error event occurs whenever one or more symbols are incorrectly decoded. In a trellis diagram commonly used in a Viterbi decoding algorithm, an error event is characterized by deviation from the correct path over a certain number of stages. FIG. 5 shows a trellis diagram in which the ideally decoded symbols should be all zeros. An ideal path can be described $[b_1\ b_2\ b_3\ b_4\ b_5]$ where b represents a correctly decoded symbol and the subscript represents the trellis stage corresponding to that symbol. In the preferred embodiment, the symbols represent bits and both terms are used interchangeably throughout this description. If the symbol at stage 2 was incorrectly decoded as a "1", the erroneous path can be described as $[b_1\ e_2\ b_3\ b_4\ b_5]$. The correct or ideal path is shown as a solid path and the erroneous path shown as a dash path. Here, a single symbol error will cause a deviation in the decoded path from the correct path over M+1 stages of the trellis, where M is the memory order of the encoder. Additional symbol errors can cause decoded path to deviate over a greater number of stages. Assuming no additional error occurs, the erroneous path and the ideal path will converge after M consecutive stages. When using a Viterbi decoder, an uncertain path decision at a stage T in the trellis implies that two paths merging into that state at that stage along the winning path were approximately equal in length. If decoded information is erroneous, this implies that a particular error event caused the decoded path to deviate from the correct path.

Preferably, the set of all error events is divided into two categories: those that are statistically probable (allowable errors), and those that are sufficiently statistically improbable to ignore. In a typical digital communication system, this set of error events can be established from the operating range of bit error rates (BER), and may also depend on the coding rate or other protection schemes used to protect the encoded symbols. For illustration purposes, $e_{max}$ is designated as the maximum number of errors considered possible to occur in a selected portion of data scheme, such as can occur in one trellis. From $e_{max}$, a set of all error events which are considered probable is defined as $\{E_{search}\}$. An error event in $\{E_{search}\}$ can have a number of errors ranging from 1 to $e_{max}$. For example, an error event could have one bit error, two bit errors, and the like.

According to the present invention, an error detection scheme using information on past decision integrity for symbol selection purposes is used to determine a point in the trellis at which there is a potential of error. In the preferred embodiment, the error detection scheme used is as described in U.S. Pat. No. 5,229,767 ('767), mentioned above.

Figure 7:
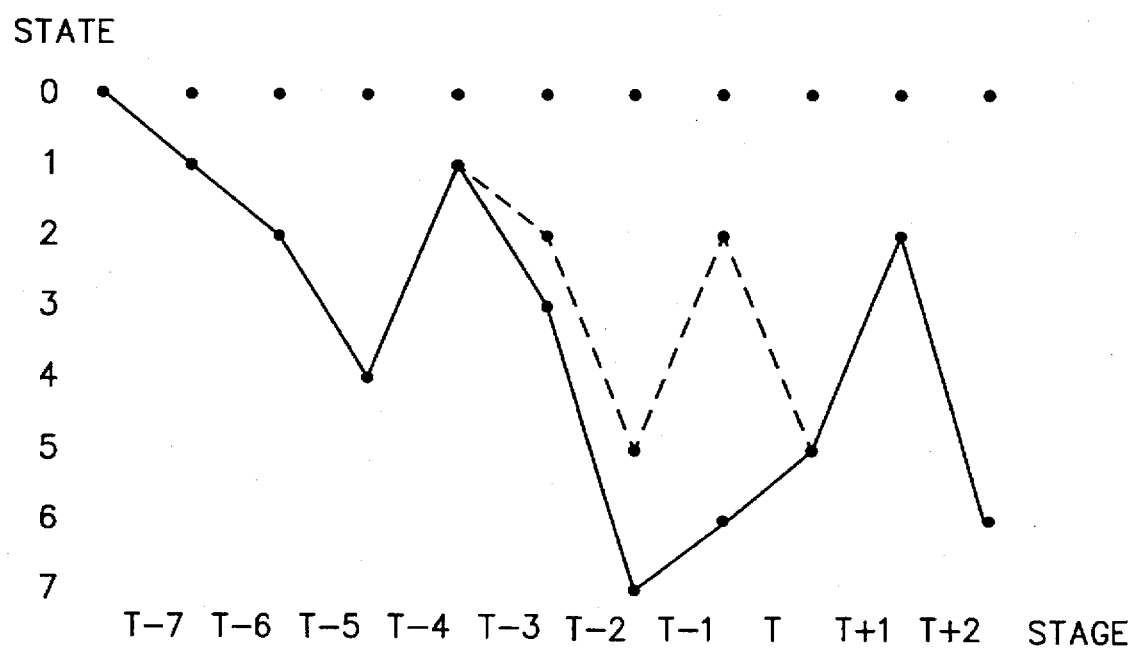
FIG. 7 is a trellis diagram of a path traceback showing the occurrence of a probable error event, in accordance with the present invention.
Figure 6:
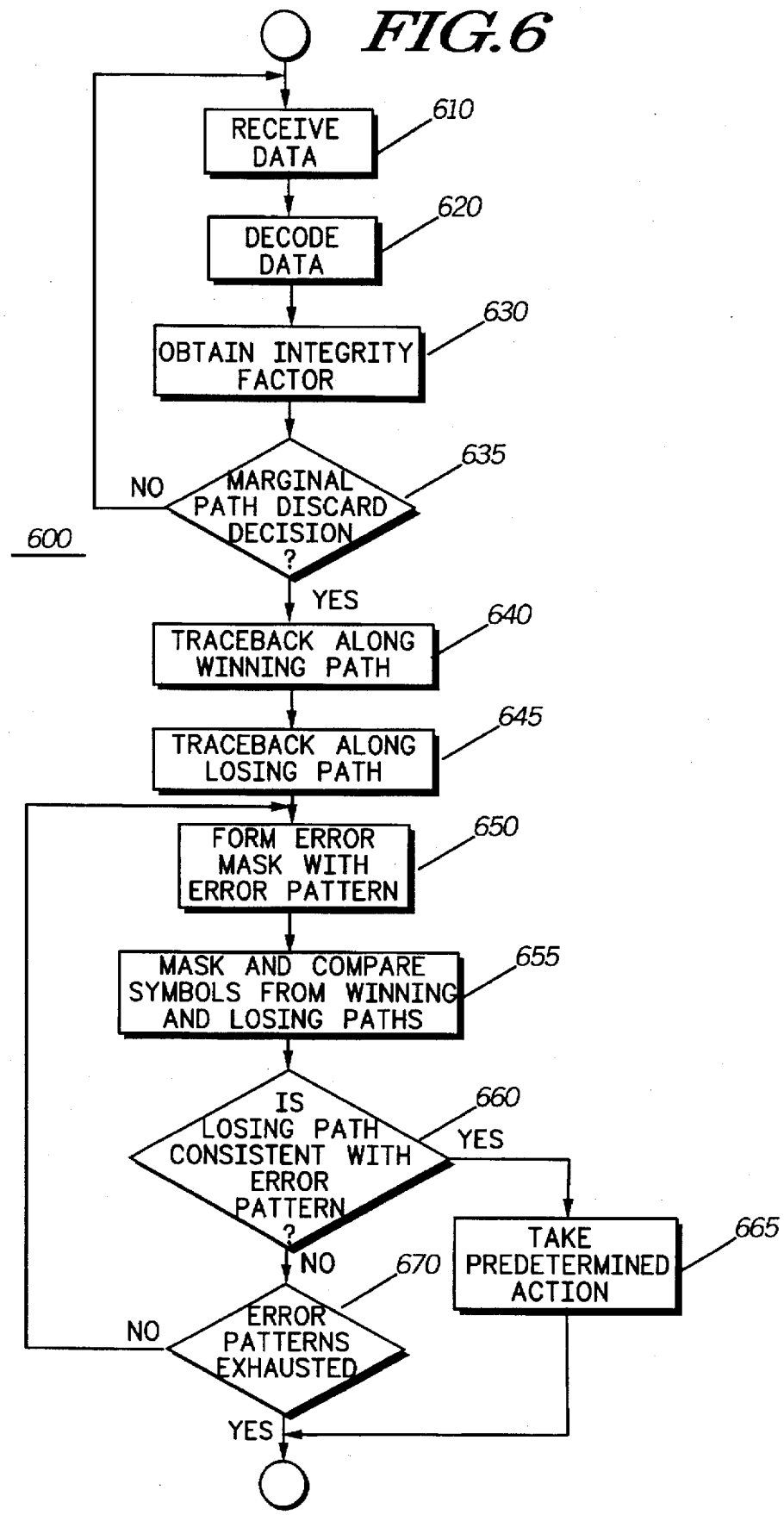
FIG. 6 is a flow chart of procedures used in the error detection scheme, in accordance with the present invention.

FIG. 6 is a flow chart of procedures 600 used in the error detection scheme, in accordance with the present invention. FIG. 7 is a trellis diagram of a path traceback showing the occurrence of a probable error event, in accordance with the present invention. Referring to FIGS. 6 and 7, a data stream representing convolutionally encoded information is received and provided to a decoder, step 610. The decoder generates decoded information from the data stream using a series of symbol selections that potentially correspond to at least a portion of the data stream, step 620. Preferably a decoder based on the Viterbi algorithm is used. The decoder determines a preferred information path representing a maximum likelihood for a series of symbols that reflect the originally encoded information. The Viterbi Algorithm decoder selects the preferred information path from a plurality of information paths while transitioning between states in a trellis having multiple stages. At various stages of the trellis, path discard decisions are obtained for discarding a losing information path in favor of a winning information path. As is typical with Viterbi Algorithm decoders, path discard decisions are based on a comparison of metrics derived for the various information paths.

While making path discard decisions, an integrity factor or reliability indication is obtained for at least some of the path discard decisions, step 630. In the preferred embodiment, the integrity of particular path discard decision is assessed for symbols of the data stream predetermined to be important, step 635. For example, if the data stream represents voice encoded data, important bits may relate to volume, pitch, and the like. The integrity factor is preferable obtained using a window error detection scheme such as described in the '767 patent. In summary, while decoding the data stream, a delta value representing the difference between metrics of information paths is generated, when a path discard decision is being made for data symbols designated as important within a selected portion of the data stream. In the preferred embodiment, the selected portion represents a frame of the convolutionally encoded information. A minimum delta value is derived for path discard decisions within the selected portion of the data stream, and this minimum delta value is compared with a weighted average of minimum delta values derived for other selected portions of the data stream. Preferably, minimum delta values are calculated on segments of the data stream identified as having enhanced error protection. The weighted average of minimum delta values represents a predetermined threshold or criteria used to assess the integrity of the particular path discard decision. A comparison of the delta value for the particular path discard decision and the weighted average of the minimum delta values which yields an unsatisfactory result, indicates that further analysis is to be performed in order to determine whether a potentially erroneous portion of the data stream exists.

According to the present invention, a traceback is performed along a series of symbol selections pertaining to decoded information. A reliability indication is developed based on whether, after adjusting for allowable error patterns, an alternative set of symbol selections would yield the decoded information within a predetermined number of symbol selections. For the Viterbi Algorithm decoder, a path traceback is performed from the point of a path discard decision to determine whether a winning information path converges with a losing information path within a predetermined number of trellis stages.

With particular reference to FIG. 7, the trellis diagram has states [0–7], and stages [T–7, T–6, T–5, T–4, T–2, T–1, T, T+1, T+2]. Assuming that a minimum delta value was founded at stage T in the trellis, that the longest error event in $\{E_{search}\}$ covers P trellis stages, and that $S_T$ is the state on the winning path at this stage. A first traceback of a total of P stages is performed along the winning information path 705 from $S_T$, step 640. As the traceback is being performed, the sequence of states that are traversed are stored as well as the sequence of symbol selections $\{B_{win}\}$ which would represent decoded information for each of the P stages. Such a traceback provides the following:

$[S_{T-1} \ S_{T-2} \ \ldots \ S_{T-P}]$=Sequence of P states back along the decoded path from $S_T$;

$\{B_{win}\}=[b_{T-1} \ b_{T-2} \ \ldots \ b_{T-P}]$=Sequence of P symbols back along the decoded path from $S_T$.

Note that $\{B_{win}\}$ forms a subset of the entire set of decoded bits obtained from the Viterbi Algorithm traceback since that traceback has been done on the winning path over a subset of the trellis stages. For example, FIG. 7 shows a traceback over four stages from trellis stage T, i.e., P=4. Here, $\{S_{win}\}=[S_{T-1} \ S_{T-2} \ S_{T-3} \ S_{T-4}]=[6 \ 7 \ 3 \ 1]$;

$\{B_{win}\}=[b_{T-1} \ b_{T-2} \ b_{T-3} \ b_{T-4}]=[1 \ 0 \ 1 \ 1]$.

Similarly, a traceback is performed along the losing path 710 into state $S_T$ at stage T, over P stages, and a corresponding sequence of states, and series of symbol selections, are stored, step 645. Hence, $\{S_{lose}\}=[S_{T-1} \ S_{T-2} \ S_{T-3} \ S_{T-4}]=[2 \ 5 \ 2 \ 1]$;

$\{B_{lose}\}=[b_{T-1} \ b_{T-2} \ b_{T-3} \ b_{T-4}]=[1 \ 0 \ 1 \ 0]$.

Next, a determination is made as to whether the winning and losing paths converge according to any one of the set of predetermined error patterns, i.e. whether any of the error events in $\{E_{search}\}$ could have occurred to cause a merge at stage T in the trellis. First a particular error pattern is selected from the set of predetermined error patterns in $\{E_{search}\}$. Correspondingly, a particular stage is selected at which the particular error pattern would have originated. For example, a one bit error would cause a deviation for 4 trellis stages where the memory order M of the encoder is 3. Next, the output data stream for the winning and losing information paths are compared by adjusting for the particular error pattern.

Preferably, a masking sequence is formed that corresponds to the particular error pattern by setting all error bit positions in the error event to "1" and all other bit positions to "0", step 650. The masking sequence is then applied to an appropriate number of symbols of the sequence $\{B_{lose}\}$ using a exclusive-OR operation. This new sequence represents a modified output data stream that is then compared with the appropriate number of symbols of the sequence $\{B_{win}\}$ to determine conformity, i.e., whether the bits compared are identical, step 655. Additionally, the state within the sequence $\{S_{win}\}$ corresponding to the error event is compared with a corresponding state in the sequence $\{S_{lose}\}$ to determine whether these states are identical, step 660.

In other words, the winning and losing information paths are determined to converge according to the particular error pattern, when any difference between the output data stream for both paths is consistent with the particular error pattern, and both paths have a matching state at a particular stage corresponding to the particular error pattern.

Similarly, each error pattern within the set of allowable errors is used to determine whether that error pattern could have potentially caused the potentially unreliable past discard decision while decoding the data stream, step 665.

By requiring that the states corresponding to a particular error event are identical between winning and losing information paths, and that all the decoded symbols are identical after adjusting for the particular error pattern, there is a substantial increase in likelihood that a particular error, selected from a set of predetermined allowable errors, caused the deviation between the winning and losing information paths. Thus a potentially unreliable path discard decision can be interpreted to have occurred at trellis stage T. Preferably, when such determination is made, a predetermined action is taken to account for the potential of erroneously decoded data at trellis stage T, step 670. This action may involve a request for retransmission of the suspect data, or the taking other action to mitigate the effects of the error.

Figure 8:
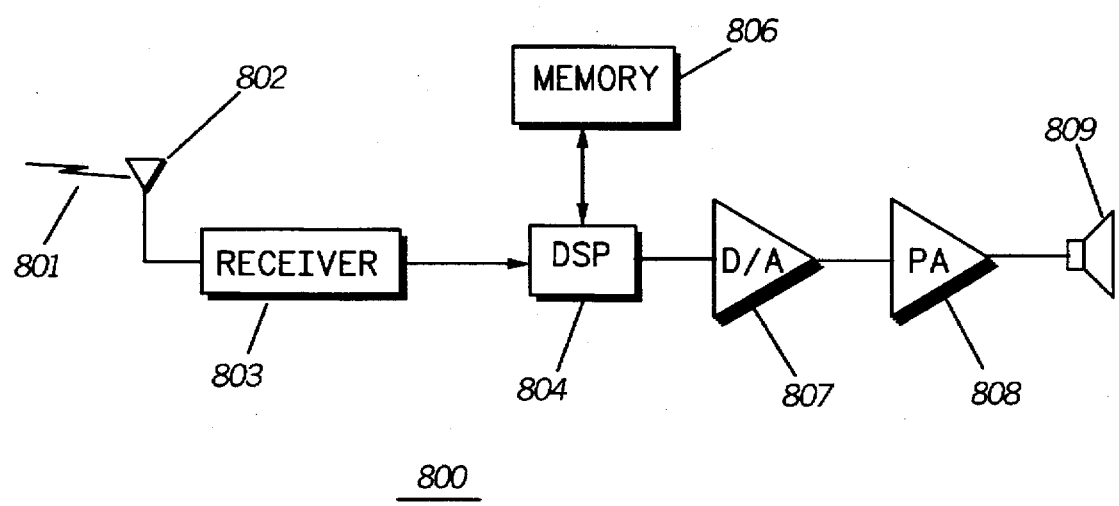
FIG. 8 is a block diagram for a radio receiver and decoder, in accordance with the present invention.

FIG. 8 is a block diagram of a radio receiver and decoder 800, in accordance with the present invention. An antenna 802 receives a carrier signal 801 having the convolutionally encoded information modulated thereon. An appropriate radio receiver 803 demodulates this information in order to extract the convolutional encoded data, which information is provided to a digital signal processor 804. The DSP 804 performs a variety of functions, including the decoding procedures described above according to the present invention. An associated memory 806 allows programming information and/or other data to be held available for use by the DSP 804. In the preferred embodiment, the encoded information comprises speech coding information, which the DSP 804 decodes. The resultant digitized synthesized speech is the provided to a digital to analog converter 807, with the resultant analog output amplified in a power amplifier 808 and rendered audible by a speaker 809.

The present invention provides significant benefits over prior art attempts to perform error detection while decoding convolutionally encoded information without the addition of error detection information to the transmitted data. An integrity assessment is made for path discard decisions used in symbol selections during decoding. Once a particular symbol, or set of symbols, are flagged as resulting from potentially unreliable symbol selection decisions, a further analysis is performed to determine whether the potentially unreliable path discard decision is consistent with allowable error patterns. Only when such consistency is verified, is the ambiguous path discard decision flagged as a potential erroneous decoding, and further action is taken for error mitigation. This approach substantially reduces the number of false errors that are reported by an error detection system using the integrity of path discard decisions as a basis.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method for decoding convolutionally encoded information, comprising the steps of:

receiving a data stream representing convolutionally encoded information;

decoding the data stream using a Viterbi Algorithm decoder, including the steps of:

determining a plurality of information paths while transitioning between states in a trellis having multiple stages;

obtaining a path discard decision, for discarding a first information path in favor of a second information path;

obtaining an integrity factor for the path discard decision;

when the integrity factor does not satisfy a predetermined threshold:

performing a path traceback to determine whether the first and second information paths converge within a predetermined number of stages; and identifying a portion of the data stream as potentially erroneous when the first and second information paths do not converge within the predetermined number of stages.

2. The method of claim 1, wherein the step of obtaining an integrity factor includes the step of comparing metrics derived for the first and second information paths.

3. The method of claim 2, wherein the portion of the data stream represents a frame of the convolutionally encoded information.

4. The method of claim 1, wherein the step of obtaining an integrity factor includes the step of generating a delta value representing a difference between the metrics of the first and second information paths.

5. The method of claim 4, wherein the step of obtaining an integrity factor comprises the steps of:

deriving a minimum delta value for path discard decisions corresponding to data symbol designated as important within a selected portion of the data stream; and comparing the minimum delta value with a weighted average of minimum delta values derived for other selected portions of the data stream.

6. The method of claim 1, wherein the step of performing a path traceback comprises the steps of:

perform traceback along the first information path for the predetermined number of stages while storing a first sequence of states and a first output data stream, corresponding to the first information path;

perform traceback along the second information path for the predetermined number of stages while storing a second sequence of states and a second output data stream, corresponding to the second information path;

determining whether the first and second information paths converge according to any one of a set of predetermined error patterns, including the steps of:

selecting a particular error pattern from the set of predetermined error patterns;

selecting a particular stage within the predetermined number of stages that corresponds to the particular error pattern;

comparing the first and second output data streams while adjusting for the particular error pattern; and determining that the first and second information paths converge according to the particular error pattern, when any difference between the first and second output data streams is consistent with the particular error pattern, and the first information path and the second information path have a matching state at the particular stage.

7. The method of claim 6, wherein the step of comparing comprises the steps of:

masking the first output data stream with an error mask for the particular error pattern to produce a modified output data stream; and determining whether the modified output data stream conforms to the second output data stream.

8. A method for processing convolutionally encoded information, comprising the steps of:

providing a data stream representing convolutionally encoded information;

generating decoded information using a series of symbol selections that potentially correspond to at least a portion of the data stream;

obtaining a first reliability indication for a particular decision made for a symbol selection;

when the first reliability indication does not satisfy a particular criteria:

performing a traceback along the series of symbol selections to develop a second reliability indication based on whether, after adjusting for allowable error patterns, an alternative set of symbol selections yields the decoded information within a predetermined number of symbol selections; and taking a predetermined action based on the second reliability indication.

9. The method of claim 8, wherein the step of obtaining a first reliability indication includes the steps of:

identifying a segment of the data stream as having enhanced error protection; and comparing metrics derived for the particular decision made for the symbol selection.

10. The method of claim 8, wherein the step of taking a predetermined action includes the step of discarding at least a portion of the decoded information.

11. The method of claim 8, wherein the step of generating decoded information includes the step of decoding symbols using a Viterbi Algorithm based decoder.

12. The method of claim 11, wherein the step of decoding symbols includes the step of making path discard decisions from comparisons of metrics for alternative information paths while transitioning through states in a trellis having multiple stages.

13. The method of claim 12, wherein the step of obtaining a first reliability indication includes the steps of:

generating a delta value representing a difference between first and second information paths when making a path discard decision;

deriving a minimum delta value for selected path discard decisions for particular portion of the data stream; and comparing the minimum delta value with a weighted average of minimum delta values derived for other portions of the data stream.

14. The method of claim 13, wherein the step of performing a traceback comprises the steps of:

performing traceback along the first information path for the predetermined number of symbol selections while storing a first sequence of states and a first series of symbol selections, corresponding to the first information path;

performing traceback along the second information path for the predetermined number of stages while storing a second sequence of states and a second series of symbol selections, corresponding to the second information path;

determining whether the first and second information paths converge according to any one of a set of predetermined error patterns, including the steps of:

selecting a particular error pattern from the set of predetermined error patterns;

selecting a particular stage within the predetermined number of stages that corresponds to the particular error pattern;

comparing the first and second series of symbol selections while considering the particular error pattern; and determining that the first and second information paths converge according to the particular error pattern, when any difference between the first and second series of symbol selections is consistent with the particular error pattern, and the first information path and the second information path have a matching state at the particular stage.

15. An apparatus, comprising:
- a receiver responsive to receive a data stream representing convolutionally encoded information; and
- a decoder, coupled to the receiver, and having an output of decoded information comprising a series of symbol selections that potentially correspond to at least a portion of the data stream, wherein the decoder obtains a first reliability indication for a particular decision made for a symbol selection, and when the first reliability indication does not satisfy a particular criteria, performs a traceback along the series of symbol selections to develop a second reliability indication based on whether, after adjusting for allowable error patterns, an alternative set of symbol selections yields the decoded information within a predetermined number of symbol selections.

* * * * *